United States Patent [19]

Thesling, III et al.

[11] Patent Number: 5,657,354

[45] Date of Patent: Aug. 12, 1997

[54] PLANAR APPROXIMATING METHOD FOR COMPUTING THE LOG-LIKELIHOOD RATIO OPTIMAL SIGNAL METRIC OF EACH COMPONENT CODE DECODER IN 8-PSK BLOCK CODED MODULATION SYSTEMS

[76] Inventors: William H. Thesling, III, 690 Turney Rd., Apt. 7, Bedford, Ohio 44126; Mark J. Vanderaar, 2991 Lester Rd., Medina, Ohio 44256

[21] Appl. No.: 441,049

[22] Filed: May 15, 1995

[51] Int. Cl.$^6$ ................................................ H04L 27/22
[52] U.S. Cl. ................................... 375/332; 375/280
[58] Field of Search .......................... 375/261, 262, 375/264, 280, 332, 341

[56] References Cited

U.S. PATENT DOCUMENTS

| | | | |
|---|---|---|---|
| 3,764,743 | 10/1973 | Melvin | 375/280 |
| 3,808,376 | 4/1974 | Melvin | 375/280 |
| 4,087,752 | 5/1978 | Melvin | 375/332 |
| 4,597,090 | 6/1986 | Forney, Jr. | 375/39 |
| 4,882,733 | 11/1989 | Tanner | 371/43 |
| 5,329,551 | 7/1994 | Wei | 375/39 |

OTHER PUBLICATIONS

H. Imai, S. Hirakawa, "A new multilevel coding method using error-correcting codes," IEEE Trans. Inform. Theory, vol. IT_23, No. 3, pp. 371–376, May 1977.

M. Vanderaar, P. Wagner, and J. Budinger, "Least reliable bits coding (LRBC) for high data rate satellite communications," Proc. AIAA 14th International Communications Satellite System Conference, Washington D.C., Mar. 1992, pp. 507–514.

S. Lin, D. Costello, Jr., Error Control Coding: Fundamantals and Applications. Englewood Cliffs, NJ: Prentice–Hall, 1983.

H. Woetrz, J. Hagenauer, "Multistage coding and decoding for a M-PSK system," Proc. IEEE Global Telecommun. Conf., San Diego, CA., Dec. 1990, pp. 698–703.

*Primary Examiner*—Stephen Chin
*Assistant Examiner*—Jeffrey W. Gluck

[57] ABSTRACT

The optimum decoding of component codes in Block Coded Modulation (BCM) schemes requires the use of the Log-Likelihood Ratio (LLR) as the signal metric. The essence of the invention is a means of accurately approximating the computation of the LLR in a way which is simple to implement directly. The invention, the Log-Likelihood Ratio Planar Approximation (LLRPA), mathematically consists solely of planar equations with fixed point arithmetic that provides both an accurate estimate of the LLR and is easily realized in electronic hardware.

8 Claims, 10 Drawing Sheets

PLANAR APPROXIMATING METHOD FOR COMPUTING THE LOG-LIKELIHOOD RATIO OPTIMAL SIGNAL METRIC OF EACH COMPONENT CODE DECODER IN 8-PSK BLOCK CODED MODULATION SYSTEMS

BACKGROUND-FIELD OF INVENTION

This invention relates to the means of computing the signal metric for the least reliable bit, or "bottom code channel bit", in 8-PSK block coded modulation communication systems. A means of computing the signal metric for the "middle bit" is also developed.

SUMMARY

The optimum decoding of component codes in Block Coded Modulation (BCM) schemes requires the use of the Log-Likelihood Ratio (LLR) as the signal metric. The essence of the invention is a means of accurately approximating the computation of the LLR in a way which is simple to implement directly. The invention, the Log-Likelihood Ratio Planar Approximation (LLRPA), mathematically consists solely of planar equations with fixed point arithmetic that provides both an accurate estimate of the LLR and is easily realized in electronic hardware.

BACKGROUND

Figure 1:
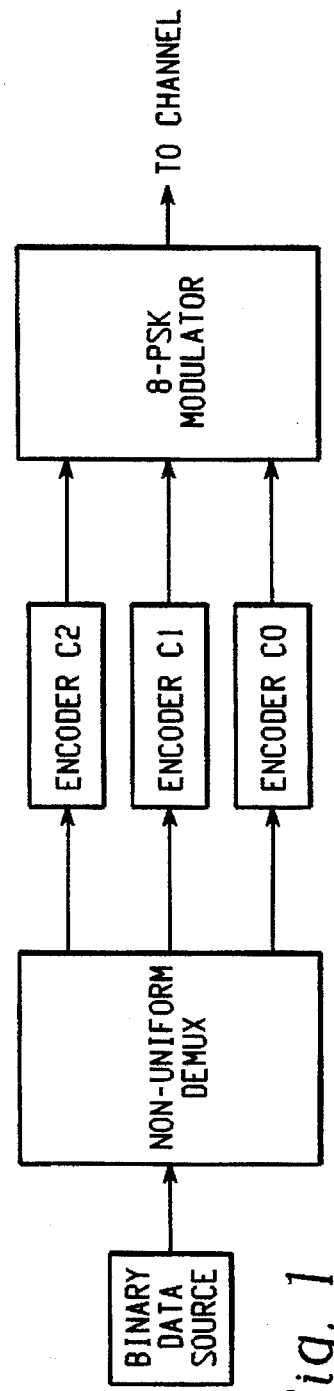
FIG. 1: Overall block diagram of the prior art of an 8-PSK multilevel encoder and modulator.

Wireless digital communications (including satellite, terrestrial microwave, and cellular) is an existing multi-billion dollar market that is perceived to be expanding from predominately low data rate services to broadband services. These Broadband Integrated Services Digital Network (B-ISDN) applications are being enabled by Asynchronous Transfer Mode (ATM), a standardized communication protocol based on high-speed packet communications in wired/fiber networks. One requirement for wireless digital communications to be competitive in this market is the introduction of practical high speed modulations and coding devices that can achieve the necessary quality of services that ATM networks demand.

Other commercial applications of satellite-based wireless digital communications include Direct Broadcast Satellite (DBS) for video and music direct to the consumer, gateway links to/from Low Earth Orbiting (LEO) satellite constellations from/to ground terminals, wireless cable television, and fiber restoration using existing transponders. Further, the United States government is championing the concept of universal service in the evolving National Information Infrastructure (NII) as well as the Global Information Infrastructure (GII). Universal service requires that even remote geographic locations have access to the network. In this case wireless communications via satellite may be the only cost-effective choice.

Many technologies are being developed to enable these new services. It is widely accepted that coded modulation systems are a valuable technique to increase capacity and thus will have an important of role in these systems. However, the currently available modulation and coding systems do not readily extend to a number of these planned high data rate services. The development of simple, high performance coded modulation schemes have the potential to provide a practical and viable solution in this niche market.

Description of Prior Art

Wireless digital communications systems are used for the efficient and flexible transmission of voice, video, and data services. Such systems must operate under the constraints of limited bandwidth and power resources. This has led to the development of information transmission techniques that use bandwidth and power efficiently at the cost of hardware complexity. The state of the art is a class of schemes collectively called trellis coded modulation (TCM) that allow the reliable transmission of information using ½ to ¼ of the power as compared to the uncoded direct transmission of data. This is attained without the use of increased bandwidth resources. TCM is used commercially in satellite communications, terrestrial microwave communications, and perhaps most widely (although at low data rates) in computer modems. The net result of the increased efficiency in these systems is increased data throughput. For example, TCM has enabled computer modems to operate at 14.4, 19.2, and 28.8 kbps.

The use of TCM has been limited in high data rate (>10 Mbps) services due to the algorithmic complexity of practical demodulators and decoders. For this reason, reduced complexity techniques are of value. Further, since TCM is more suited for continuous transmission, it becomes an awkward format as data services and networks migrate towards more bursty or packet oriented systems.

Imai-Hirakawa coding schemes [1], also called block coded modulation (BCM) can achieve Trellis-Coded Modulation (TCM) performance in a block structure. They can be an alternative to TCM in systems where a block format, code flexibility, and decoding speed are important. Though a BCM scheme is generally not maximum likelihood (ML), its structure can offer more coding for less complexity than TCM in many systems.

The BCM structure applies individual codes for each bit in a modulated symbol. These component codes are denoted $C_0, C_1, \ldots, C_{n-1}$ where n is the number of bits in the symbol. Each component code can be a block or convolutional code, and the codes are typically decoded with channel measurement information (soft decisions). The error correcting capability of the $i^{th}$ component code is chosen in accordance with the channel bit error probability associated with the $i^{th}$ (i=0, 1, ..., n−1) bit in the modulated symbol as well as taking into account information provided by the decoder from the i−1$^{th}$ decoder. Usually the overall goal is to "balance" the system by obtaining approximately the same decoded error probability for each decoder's decoded bits.

Figure 2:
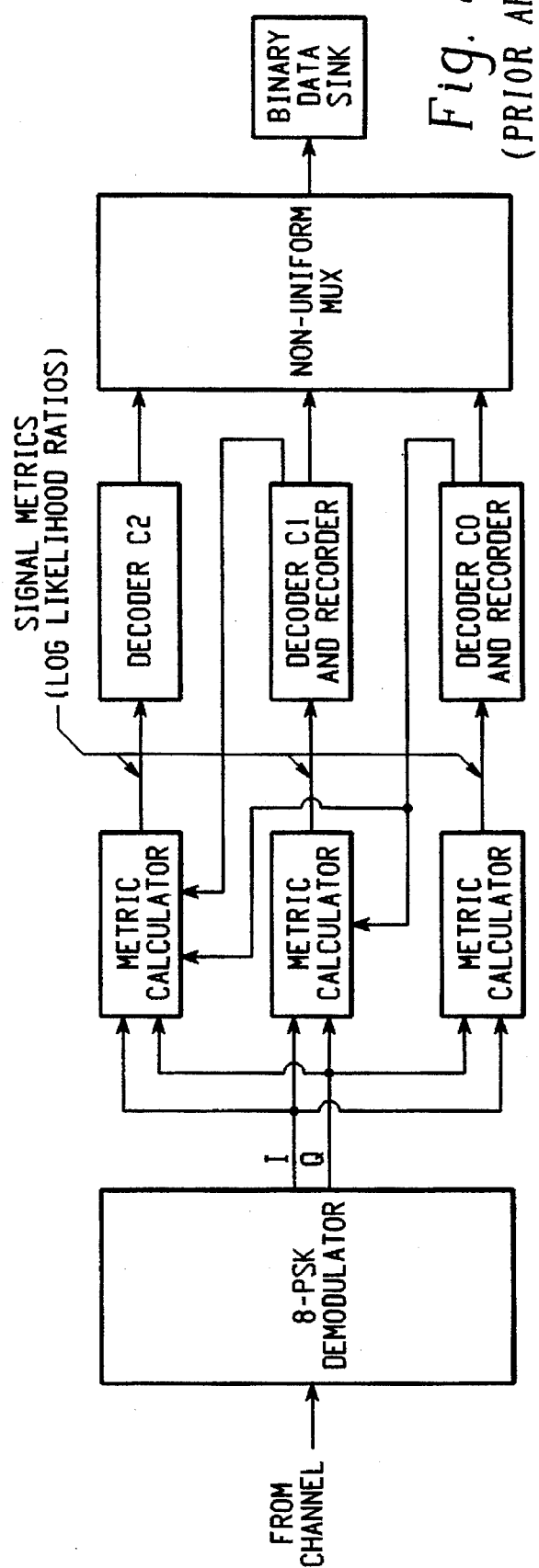
FIG. 2: Overall block diagram of the prior art of an 8-PSK multilevel multistage decoder and demodulator.
Figure 3:
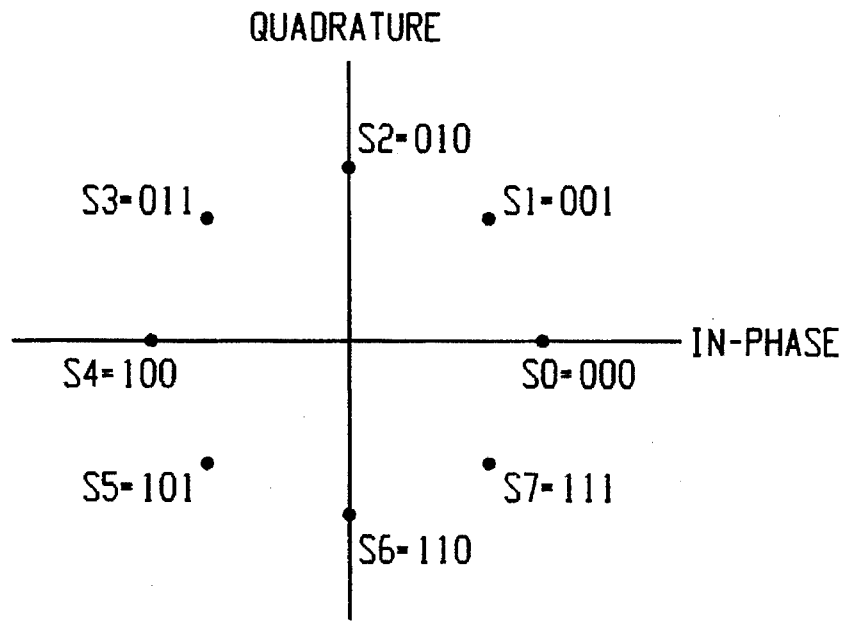
FIG. 3: Constellation diagram showing the prior art 8-PSK phase mapping and bit to symbol assignments.

In applications such as satellite and mobile communications, the digital modulation format 8-PSK is one emerging as a practical choice in bandwidth and power limited situations. One example of BCM applied to 8-PSK uses three component codes, one for each bit in an 8-PSK (n=3) symbol. The associated encoder and decoder structures are illustrated in FIGS. 1 and 2. In order to obtain a benefit from multistage decoding the least significant bit (right most bit) in the 8-PSK signal constellation must alternate between binary 0 and 1 as the symbols are defined from 0 to $7\pi/8$ radians [2]. A mapping that fits this criterion is shown in FIG. 3. Each symbol is defined to have a power normalized to 1.

Multistage decoding requires that the bottom code, $C_0$, is decoded first. It is a fact seldom recognized in the literature that the optimum signal metric for maximum likelihood decoding (MLD) of this (bottom) code is the log-likelihood ratio (LLR) [3, 4]. In 8-PSK, as in the constellation in FIG. 3, the LLR of the rightmost bit or the least reliable bit (LRB) being a binary 0 can be expressed as $$LLR(I,Q) = \ln \left[ \frac{\sum_{i=0,even}^{7} e^{-(E_s/N_0)d_i^2}}{\sum_{i=0,odd}^{7} e^{-(E_s/N_0)d_i^2}} \right],$$

where, $E_s$ is the energy per symbol, $N_o$ is the single sided noise power spectral density, $d_i$ is the distance from the (I,Q) point to the $i^{th}$ symbol in the constellation. This expression contains the likelihood of each of four symbol that contain a binary 0 in the LRB in the numerator and the likelihood of each of four symbol that contain a binary 1 in the denominator. Note that the LLR(I,Q) is computed under the assumption of additive white Gaussian noise.

An explicit evaluation of the LLR in real-time is very undesirable in any practical system due to the number of complicated mathematical operations required. For this reason a look-up table LUT) approach is used in which the values of the LLR at a particular $E_s/N_o$ are calculated off-line and stored in defeated memory. If the received components I and Q are quantized to 8 bits each, then a look-up table would have $2^8 \times 2^8 = 65536$ memory addresses. If each address contains 6 bits to maintain good quantization accuracy this corresponds to a 65,536×6 memory. A static random access memory (SRAM) that used 5 transistors per cell would require 1.97×10$^6$ transistors! This ignores the transistors required for column decoders, row decoders, and read/write circuitry.

the often quoted signal metric is the minimum squared Euclidean distance metric. Although this metric is easier to calculate then the log likelihood ratio, it is still complex, and it also is often implemented via a look up table method. Moreover, this metric is sub-optimal and may increase the complexity of the decoder.

Description of the Preferred Embodiment(s)

Figure 4:
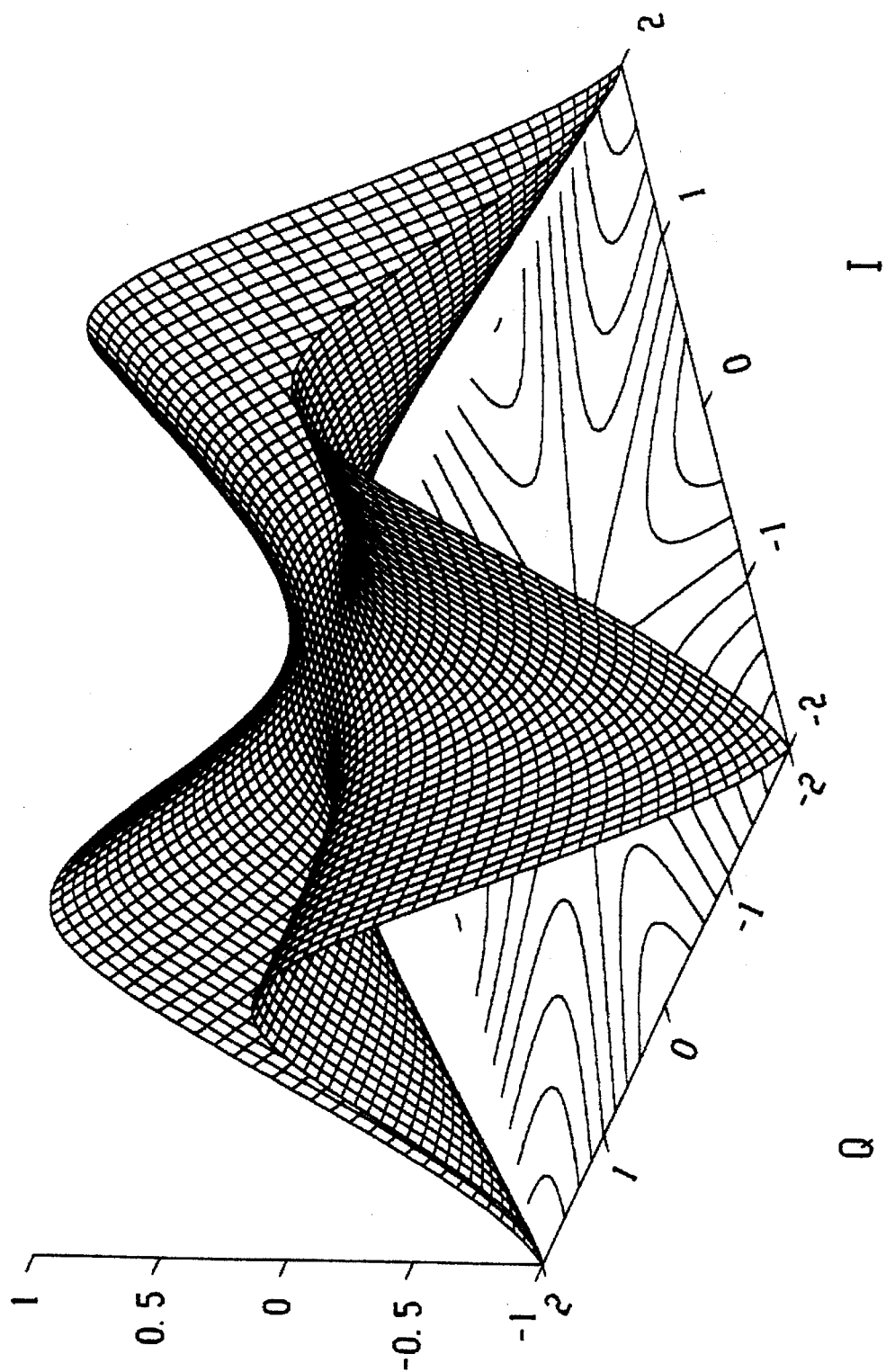
FIG. 4: A plot of the LLR as a function of the in-phase (I) and quadrature (Q) signal components for a symbol to noise ratio ($E_s/N_o$) equal to 2.0 dB.
Figure 5:
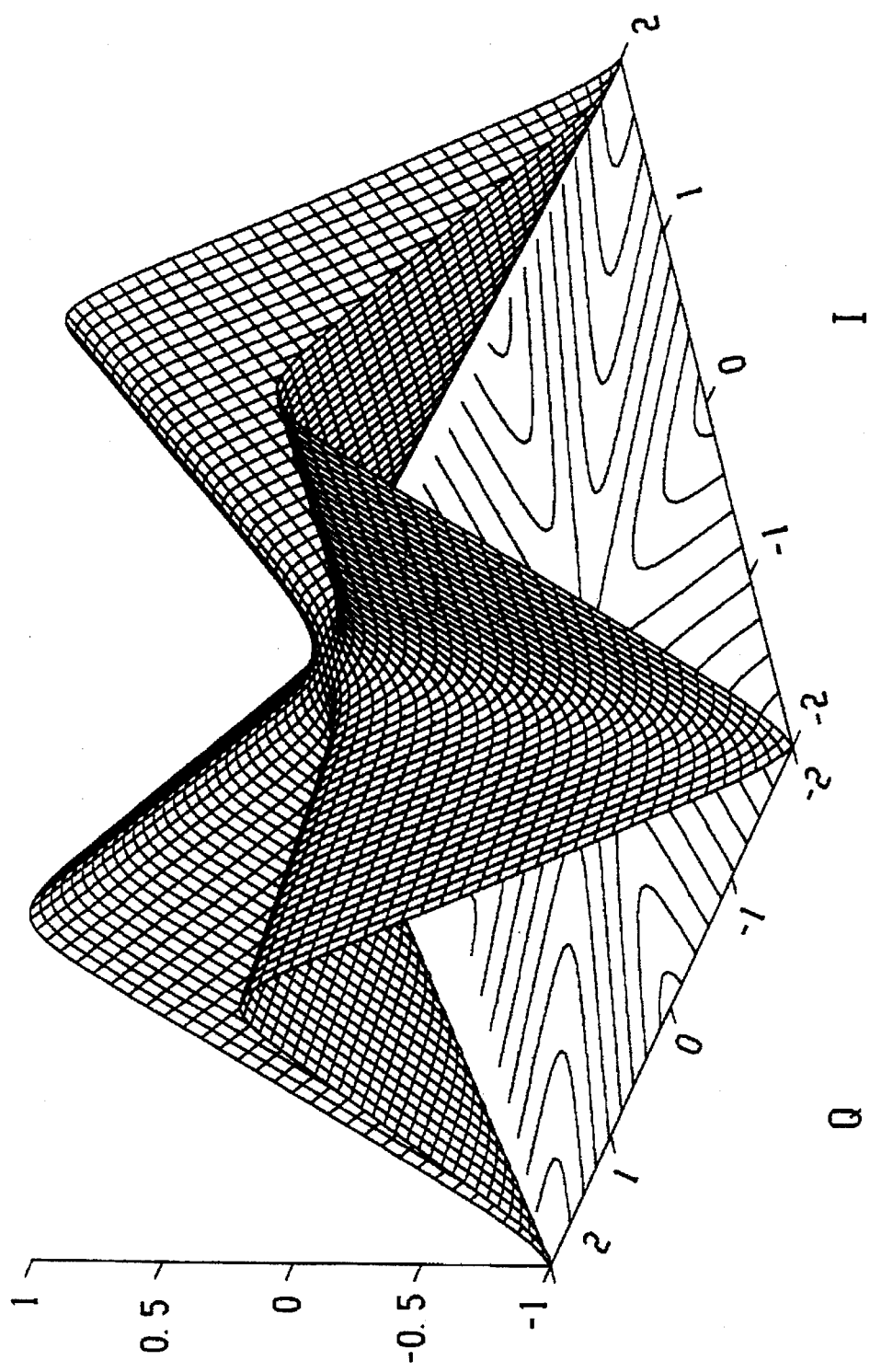
FIG. 5: A plot of the LLR as a function of the in-phase (I) and quadrature (Q) signal components for a symbol to noise ratio ($E_s/N_o$) equal to 6.0 dB.
Figure 6:
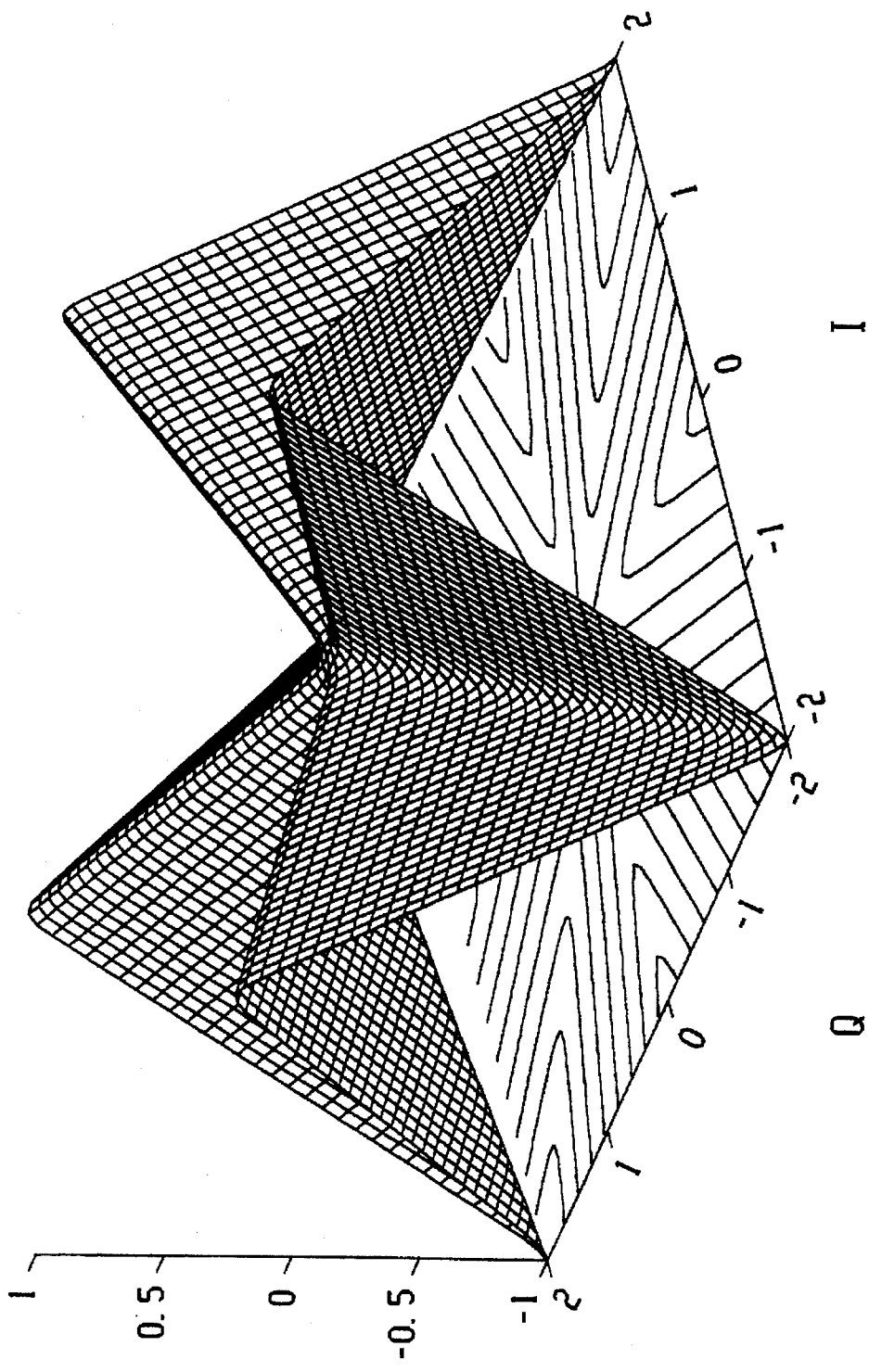
FIG. 6: A plot of the LLR as a function of the in-phase (I) and quadrature (Q) signal components for a symbol to noise ratio ($E_s/N_o$) equal to 10.0 dB.

The essence of the invention is a means of accurately approximating the computation of the LLR in a way which is simple enough to be implemented directly. The true LLR as a function of the in-phase (I) and quadrature (Q) components, as a function of the $E_s/N_o$ equal to 2, 6, and 10 dB is plotted in FIGS. 4–6, respectively. Note that in each case the LLR has been normalized so that the maximum absolute value is equal to 1 in each of these plots. Closer inspection of FIG. 6 illustrating the LLR at an $E_s/N_o$ of 10 dB, reveals large nearly planar regions with curved transitions between these regions. We propose an approximation method which mathematically consists solely of planar regions. The value of 10 dB is of particular relevance because it is near the required $E_s/N_o$ to obtain a bit error rate (BER) of 10$^{-6}$, that is commonly required in practical coded systems. Note that the LLR for the given 8-PSK constellation is symmetric about the first quadrant. This results in the observation that the LLR is invariant with respect to the absolute value function for both the in-phase (I) and quadrature (Q) channels. Therefore, by replacing I and Q with their respective absolute values, the problem is reduced to the evaluation of one of two planar equations as a function of |I| and |Q|. The two remaining "planes" are symmetric about the line |I|=|Q|. Therefore, if |I|>|Q| only one planar equation at (|I|,|Q|) needs to be evaluated. If |I|<|Q| the planar equation is evaluated at (|Q|,|I|). The equation of the LLR planar approximation (LLRPA) can be expressed as, $$LLRPA(I,Q) = \max \left\{ \begin{array}{l} \alpha \times abs(I) - \beta \times abs(Q) \\ \alpha \times abs(Q) - \beta \times abs(I) \end{array} \right\}$$

Where, $$\frac{\alpha}{-\beta} = \tan 22.5° \cong 0.41421$$

Both $\alpha$ and $\beta$ are positive. It is important to remember that these values, whether the exact LLRs or the LLR planar approximations, are the soft decision metrics to be sent to the decoder. The performance of the decoder does not depend on the absolute size of the metrics. Thus, any positive scaling factor that is convenient can be chosen since multiplying all outputs by some positive constant has no effect on the performance of the decoder. This translates into a freedom of choice for one of the two values of $\alpha$ and $\beta$. The other value is determined by the ratio between $\alpha$ and $\beta$. If one considers fixed point arithmetic (integers) $\alpha$=29, and $\beta$=70 preserves the ratio very well. Therefore, the equation of the log likelihood ratio planar approximation can be expressed as $$LLRPA(I,Q) = \max \left\{ \begin{array}{l} 29 \times abs(I) - 70 \times abs(Q) \\ 29 \times abs(Q) - 70 \times abs(I) \end{array} \right\}$$

Figure 7:
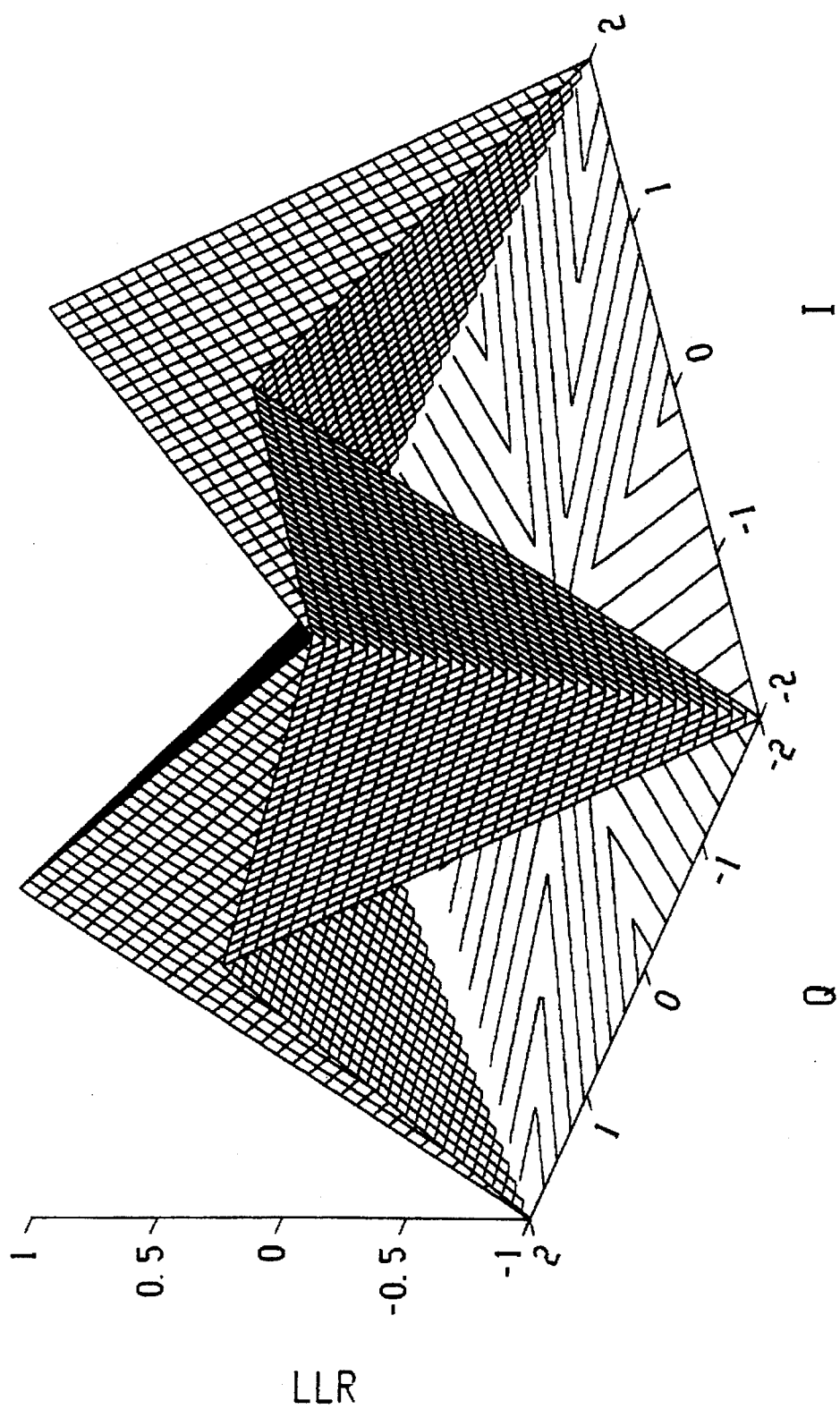
FIG. 7: A plot of the LLR Planar Approximation (LLRPA) as a function of the in-phase (I) and quadrature (Q) signal components.

The evaluation of the LLRPA as a function of I and Q is plotted in FIG. 7. Unlike the exact values for the LLR, the planar approximation is not dependent on the $E_s/N_o$. Visually, the plot looks like an increasingly good fit to the LLR as the $E_s/N_o$ increases.

There are several ways of mathematically representing LLRPA(I,Q). The two most useful are:

$$LLRPA(I,Q) = \max \left\{ \begin{array}{l} 29 \times abs(I) - 70 \times abs(Q) \\ 29 \times abs(Q) - 70 \times abs(I) \end{array} \right\}$$

and $$LLRPA(I,Q) = 29 \times \max \left\{ \begin{array}{l} abs(I) \\ abs(Q) \end{array} \right\} - 70 \times \min \left\{ \begin{array}{l} abs(I) \\ abs(Q) \end{array} \right\}$$

It should also be mentioned that the +29 and the −70 can be swapped. This will change the sign of the result. In this case, the decoder will need to look for a minimum "path" as opposed to a maximum.

Figure 10:
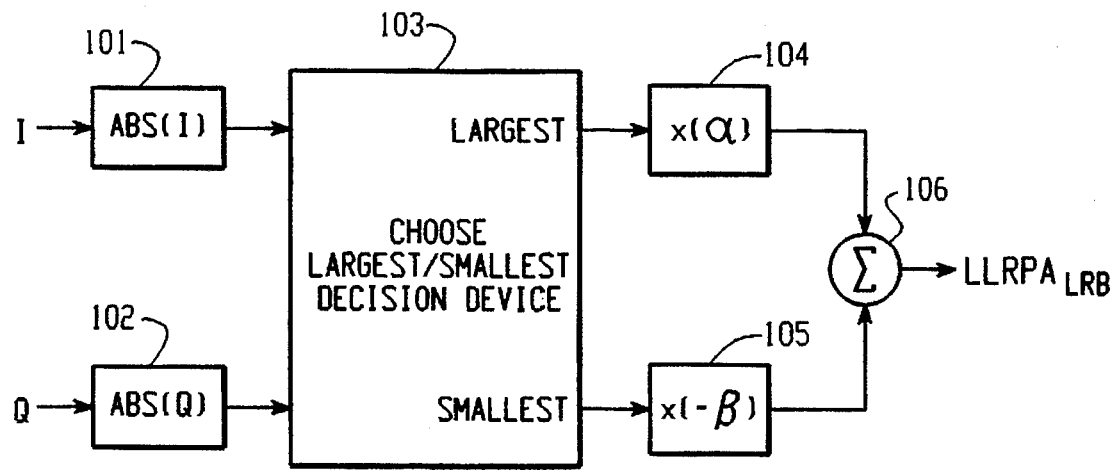
FIG. 10: A block diagram of the preferred embodiment of the least reliable bit LLRPA.
Figure 12:
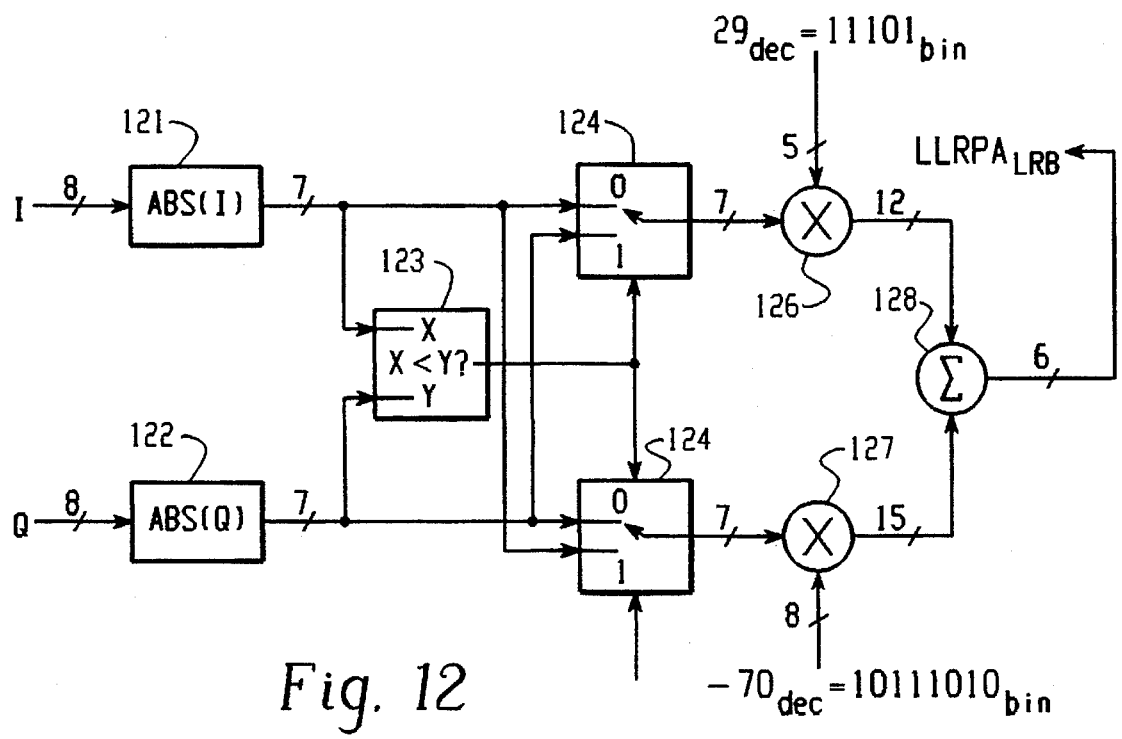
FIG. 12: A block diagram of a digital implementation of the preferred embodiment of the least reliable bit LLRPA.

The preferred embodiment implements the second equation of the LLRPA(I,Q) given above, and is illustrated in the block diagram in FIG. 10. A more specific diagram of the preferred embodiment is illustrated in FIG. 12.

The complexity of the LLRPA implementation can be approximated through a rough estimation of the complexity in terms of gates for each of these functions. These gate counts are then converted to an overall estimate of transistor count. The accuracy of the approximation is subject to the goals of a particular system in terms of speed, power consumption, or real estate. Further, the number representation presented by the upstream hardware and required by the downstream hardware can also be relevant.

First, in its worst case, the absolute value function requires a magnitude compare, a select, and then an 8 bit addition or subtraction, requiring a rough total of 200 gates. Second, the magnitude comparison and select require about 80 gates. Next, the fixed multiplies can be realized by shifts and adds resulting in about 250 gates. The final subtractor requires approximately 200 gates and the divider chooses the 6 MSBs. Assuming an average of 10 transistors per gate, the total approximate transistor count is 7300. This compares very favorably with the $1.97 \times 10^6$ transistors required for the look up table method. A reduction by a factor of 270!

Performance: Accuracy of the approximation

Figure 8A:
FIG. 8: (a) A channel model using the LLRPA as the method of metric computation. (b) A channel model considering the LLRPA as an additional noise process after the LLR (c) A channel model considering the LLRPA as and additional Additive White Gaussian Noise (AWGN) process.
Figure 8B:
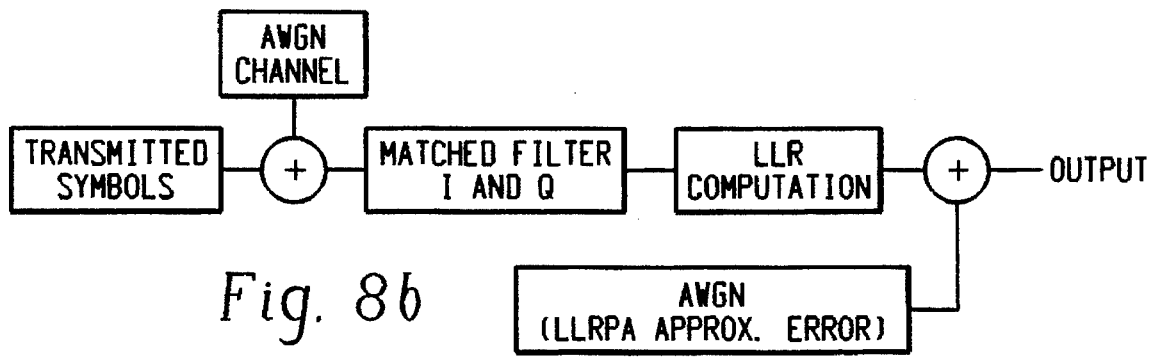

Because the LLRPA is an approximation to the LLR, use of the LLRPA will result in a loss of performance as measured in BER for a given signal-to-noise ratio (SNR). Conversely, one can find the required increase in SNR to obtain the same BER performance. We will perform an error power analysis to find the "effective" SNR degradation due to the use of the LLRPA as compared to the exact LLR. The approach finds the power associated with the LLRPA and considers it as an additional noise term. This noise is considered as an effective increase in the channel noise as depicted in FIG. 8 (a, b, c). This analysis yields an upper estimate since both the effect of the non-linearity associated with LLR device, and the fact that the noise term associated with FIG. 8b (the LLRPA noise) is correlated to the channel noise are both ignored. The LLRPA noise in FIG. 8b is the error noise of the approximation. Although this noise is i.i.d. and therefore white, it is not Gaussian. However, since a decoder effectively adds and subtracts many outputs, the intermediate values tend toward a Gaussian distribution giving a valid approximate error power analysis.

Figure 8C:
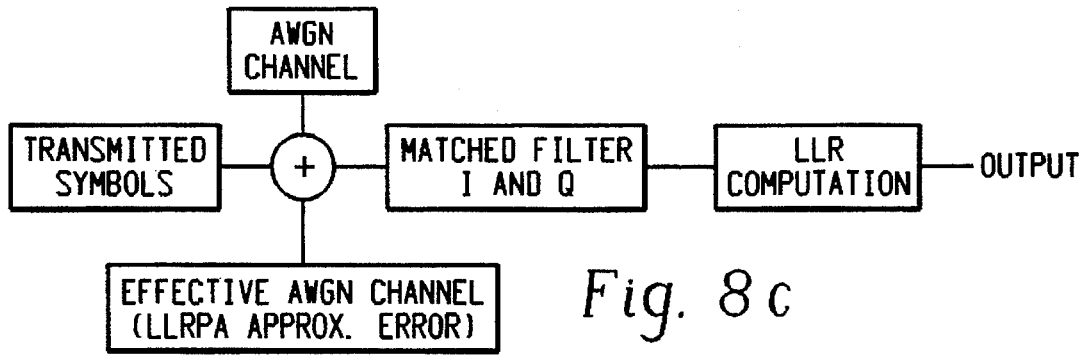

The relative size of the LLRPA noise term associated with FIG. 8c is estimated by the relative size of the noise term associated with FIG. 8b. In other words, the expected power in the noise term in FIG. 8b is used to compare to the expected power in the output from the exact LLR. The error power is given by the expected value of the squared difference signal. The difference signal is given by:

$$DS(I,Q) = LLR(I,Q) - \lambda[LLRPA(I,Q)]$$

$$DS(I,Q) = \ln\left[\frac{\sum_{i=0,\text{even}}^{7} e^{-(E_s/N_0)d_i^2}}{\sum_{i=0,\text{odd}}^{7} e^{-(E_s/N_0)d_i^2}}\right] - \lambda\max\left\{\begin{array}{l} 29abs(I) - 70abs(Q) \\ 29abs(Q) - 70abs(I) \end{array}\right\}$$

The coefficient $\lambda$ is a scaling factor to find the best fit between the LLR and the LLRPA. The best fit is defined when the expected value of the squared difference is minimized. As mentioned, a scaling factor on the LLRPA does not effect the performance of the decoder. The coefficient $\lambda$ is therefore omitted in any real system, though it is important in an analysis of error power.

Once the difference signal DS(I,Q) is determined, the expected value of the squared error is found as $$E[DS^2] = \sum_{i=0}^{7} P(S_i) \iint p_i(I,Q|S_i) DS^2(I,Q) dI dQ,$$

where $P(S_i)$ is the probability that the $i^{th}$ signal was sent, and $p_i(I,Q|S_i)$ is the probability of receiving the point (I,Q) given the $i^{th}$ signal constellation point was transmitted. If the assumption is made that the eight signals are equally likely, this simplifies to $$E[DS^2] = \iint p(I,Q|S) DS^2(I,Q) dI dQ.$$

Here p(I,Q|S) is the probability of receiving the point (I,Q) given a particular symbol was transmitted. The expected squared difference signal can then be related to the expected squared signal or signal power (after the LLR operation). This is essentially the expected squared output (no approximation) which is given by;

$$E[LLR^2] = \iint p(I,Q|S) LLR^2(I,Q) dI dQ$$

The ratio $$\frac{E[DS^2]}{E[LLR^2]}$$

is an estimate of the additional noise to signal ratio due to the log likelihood ratio planar approximation. An estimate of the overall signal to noise ratio is obtained by $$SNR_{estimate} = \frac{1}{\frac{1}{SNR_{channel}} + \frac{E[DS^2]}{E[LLR^2]}}$$

In dB, this corresponds to a reduction in SNR given by, $$SNR_{db,reduction} = SNR_{channel,db} - SNR_{estimate,db}$$

Figure 9:
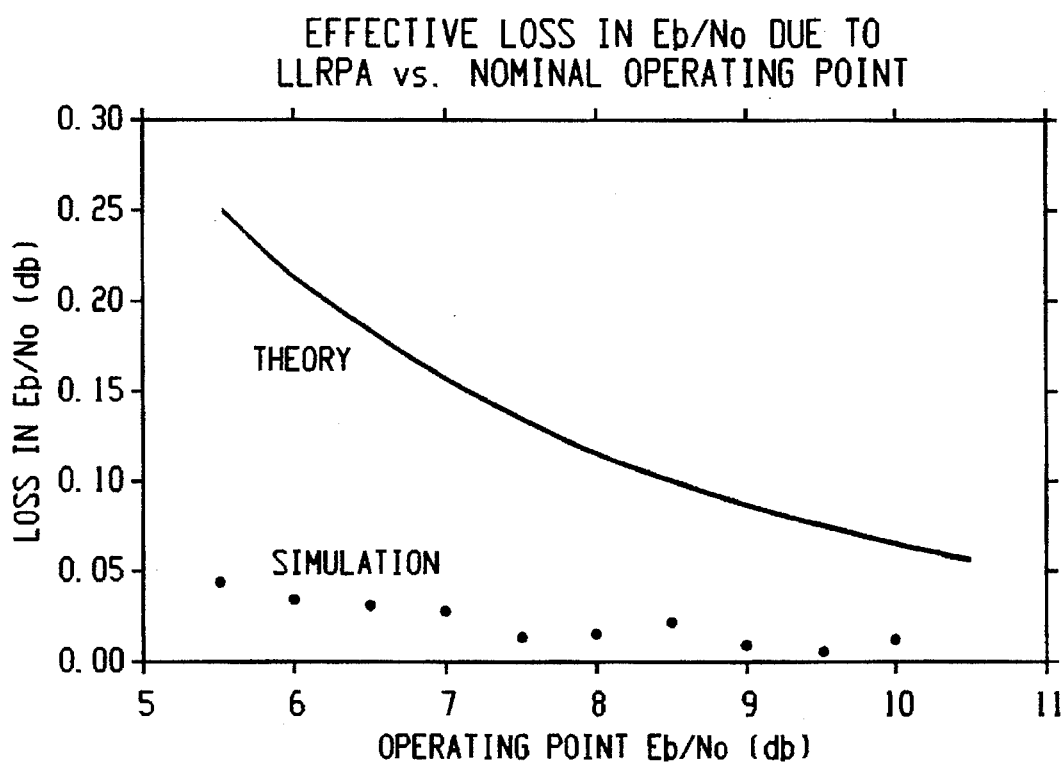
FIG. 9: The theoretical and simulated loss in SNR as a function of the operating SNR for the LLRPA metric computation compared to the LLR.

A plot of the theoretical reduction in SNR as a function of operating SNR is shown in FIG. 9. To get a better "real" measure of this degradation, a simulation was performed. This simulation considered only the bottom code C0. The code used was a 16 state, rate ¼ convolutional code given in [3] with 8 bits of input quantization on both I and Q. For a SNR of 10 dB (Eb/No), the BER performance of this code is near $10^{-6}$. We can see that the SNR loss is roughly 0.02 dB. When one considers that the coding gain associated with soft decision decoding (over hard decision decoding) is greater then 2.0 dB, this suggests that the loss associated with the LLRPA is less then 1%! The loss computed theoretically is roughly 0.075 dB. In either case, we conclude that the LLRPA is an excellent approximation to the optimal signal metric Log-Likelihood Ratio.

LLR and the C1 code

Once the bottom code C0 is decoded and re-encoded, the re-encoded data is used to determine which of two 4-PSK symbol sets is used for the remaining 2 bits. That is set {S0,S2,S4,S6} or set {S1,S3,S5,S7} with respect to FIG. 3. Given one of these two sets, the least reliable bit (which is really the middle bit now) must also alternate between 0 and 1 as the symbols are encountered moving around the circumference of the circle. The data impressed onto this symbol is from the C1 code. For decoding purposes, the optimum signal metric is the log likelihood ratio for this constellation. If we consider the set {S0,S2,S4,S6} then the LLR of the right most bit (middle bit) being a binary 0 verses being a 1 can be expressed as, $$LLR_{4PSK}(I,Q) = \ln\left[\frac{\sum_{i=0,4} e^{-(E_s/N_0)d_i^2}}{\sum_{i=2,6} e^{-(E_s/N_0)d_i^2}}\right]$$

which can be approximated by, $$LLRPA_{4PSK} = abs(I) - abs(Q)$$

We state without proof that the error associated with this approximation is less than that associated with C0. It should be mentioned that if the set in question is the set {S1,S3, S5,S7}, then a "rotation" operation of 45° will need to be performed.

Objects and Advantages

Specifically, the objects and advantages of the invention are:

To provide a simple and accurate means of computing the LLR signal metric.

To provide an accurate means of computing the LLR signal metric that can be incorporated onto a block coded modulation decoder integrated circuit chip.

To provide an accurate means of computing a signal metric that doesn't significantly increase the decoder complexity.

To provide an accurate means of computing a signal metric for the middle bit that is simple, and eliminates the need for a look-up-table(s).

The LLRPA can be used in ANY block coded modulation scheme using 8-PSK and sending coded data on the least reliable bit.

Detailed Functional Description

FIG. 10 is a basic block diagram of the preferred embodiment of the LLRPA. The I and Q values come from a demodulator output. The I value is connected to an absolute value circuit (101), and the Q value is connected to an absolute value circuit (102). These circuits output the absolute values of I and Q respectively (|I| and |Q|). The outputs of 101 and 102 (|I| and |Q|) are both connected to a single decision device (103). This decision device has two inputs and two outputs. The operation of the decision device is to place the value which is the larger of the two inputs on one output, (in this case the top output in FIG. 10) and place other value (the smaller of the two inputs) on the other output (the bottom output in the FIG. 10). The larger valued output of 103 is then connected to a multiply circuit or a gain circuit (104) which multiplies the value by fixed a quantity α. The smaller values output of 103 is connected to another multiply circuit or gain circuit (105) which multiplies the value by fixed quantity -β. The outputs of the two multiply circuits 104 and 105 are connected to a summing circuit (106). The output of the summing circuit is the LLRPA. The LLRPA value would then be connected to the input of the bottom code decoder.

Figure 11:
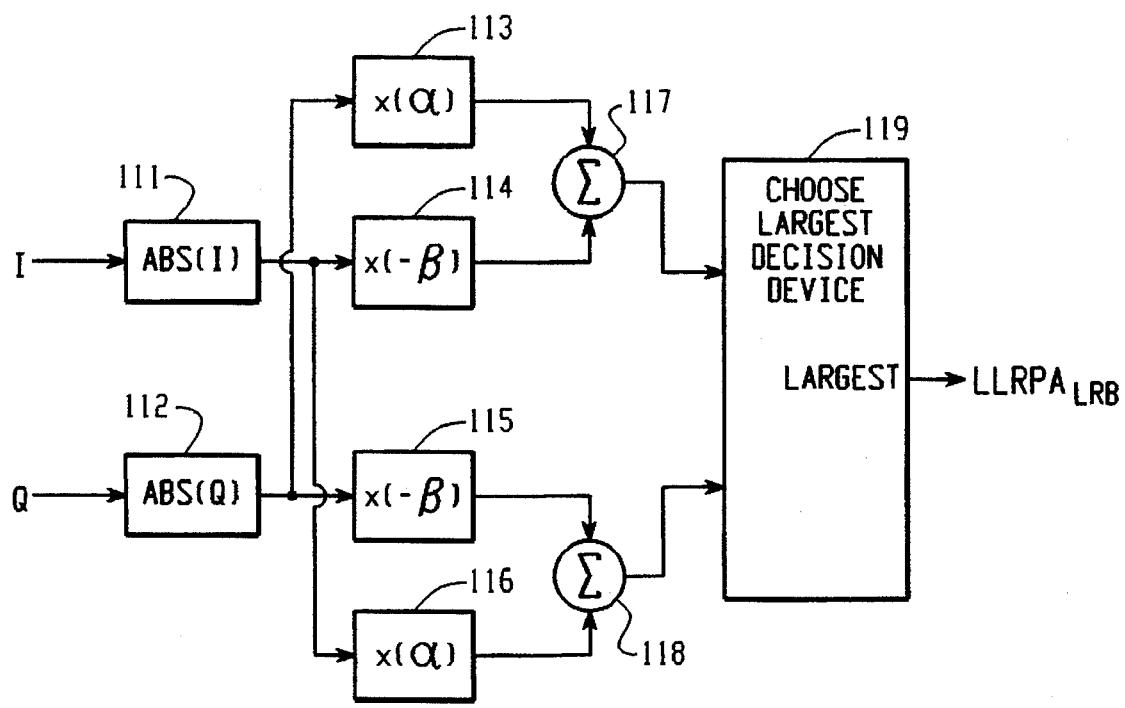
FIG. 11: A block diagram of an alternate embodiment of the least reliable bit LLRPA.

FIG. 11 is a basic block diagram of an alternate embodiment of the LLRPA. The I and Q values come from a demodulator output. The I value is connected to an absolute value circuit (111), and the Q value is connected to an absolute value circuit (112). These circuits output the absolute values of I and Q respectively (|I| and |Q|). The output of 111 (|I| is connected to two different multiply circuits or gain circuits (114) and (116). 114 multiplies its input by -β and places this product on its output. 116 multiplies its input by α and places this product on its output. Similarly, the output of 112 (|Q|) is connected to two different multiply circuits or gain circuits (113) and (115). 113 multiplies its input by α and places this product on its output. 115 multiplies its input by -β and places this product on its output. The outputs of 113 and 114 are sent to a summing circuit (117). The output of 117 is the sum of the outputs of 113 and 114. Similarly, the outputs of 115 and 116 are sent to a summing circuit (118). The output of 118 is the sum of the outputs of 115 and 116. The outputs of 117 and 118 are both connected to a single choose largest decision device (119). The function of the decision device is to place the value which is the larger of the two inputs on the output. This output is the LLRPA. The LLRPA value would then be connected to the input of the bottom code decoder.

FIG. 12 is a digital implementation of the preferred embodiment of the LLRPA. It can be seen that this Figure follows the same functional flow as FIG. 10, however it depicts a digital implementation where all values remain as integers via binary representation. The I and Q values come from a demodulator or a digital filter, and are represented as 8 bit integers. The I value is connected to an absolute value circuit (121), and the Q value is connected to an absolute value circuit (122). These circuits output the absolute values of I and Q respectively (|I| and |Q|) in 7 bit representation. The outputs of 121 and 122 (|I| and |Q|) are both connected to a single decision device (123) and to two 14 input, 7 output multiplexers (124 and 125). The function of the decision device it to determine which 7 bit input value is larger. If the output from 122 is larger then the output from 121 then the output of the decision device is a single bit logical 1. Otherwise the output is a logical 0. The output of this decision device (123) is connected to the control input of each of the two multiplexers (124 and 125). The three devices (123, 124, and 125) operate together to perform the function of device 103 in FIG. 10. The 7 bit output of 124 is then connected to an integer multiply circuit or gain circuit (126) which multiplies the value by a fixed quantity 29 (11101 in binary notation) resulting in a twelve bit product. The 7 bit output of 125 is connected to another integer multiply circuit or gain circuit (127) which multiplies the value by fixed quantity −70 (10111010 in 2s complement binary notation) resulting in a fifteen bit product. The outputs of these two multiply circuits 126 and 127 are connected to a summing circuit (128). Device 128 will add the twelve bit output from 126 and the fifteen bit output from 127. Normally this operation would result in a fifteen bit sum however, since a decoder would rarely require 15 bits of resolution, the summing device (128) need only be built with concern for just a few of the most significant bits. In this case, only the six most significant bits are considered. The six bit output of the summing circuit (128) is the LLRPA and would be connected to the input of a decoder.

Figure 13:
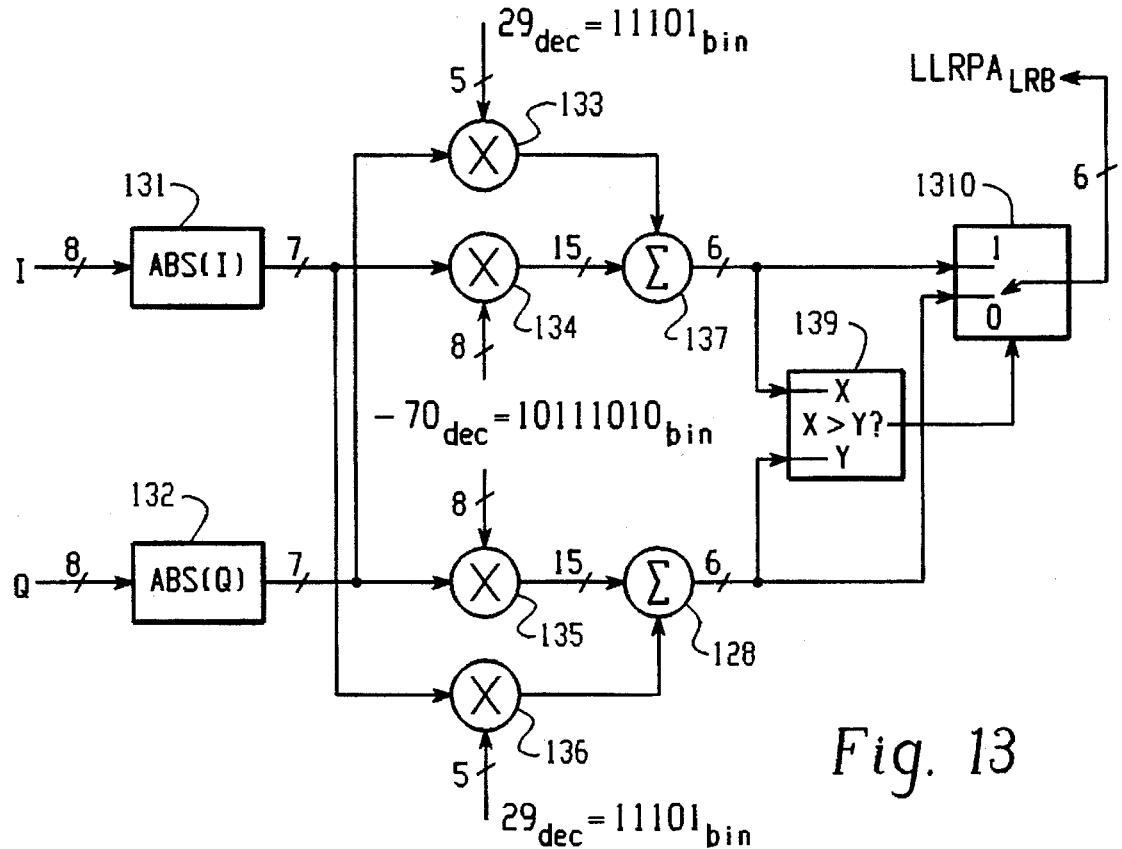
FIG. 13: A block diagram of a digital implementation of an alternate embodiment of the least reliable bit LLRPA.

FIG. 13 is a digital implementation, alternate embodiment of the LLRPA. It can be seen that this figure follows the same functional flow as FIG. 1 however, it depicts a digital implementation where all values remain as integers via binary representation. The I and Q values come from a demodulator or a digital filter, and are represented as 8 bit integers. The I value is connected to an absolute value circuit (131), and the Q value is connected to an absolute value circuit (132). These circuits output the absolute values of I and Q respectively (|I| and |Q|) in 7 bit representation. The output of 131 (|I|) is connected to two different multiply circuits or gain circuits (134 and 136). 134 multiplies its input by a fixed quantity −70 (10111010 in 2s complement binary notation) resulting in a fifteen bit product and places this product on its output. 136 multiplies its input by fixed quantity 29 (11101 in binary notation) resulting in a twelve bit product and places this product on its output. Similarly, the output of 132 (|Q|) is connected to two different multiply circuits or gain circuits (133 and 135). 133 multiplies its input by a fixed quantity 29 (11101 in binary notation) resulting in a twelve bit product and places this product on its output. 135 multiplies its input by fixed quantity −70 (10111010 in 2s complement binary notation) resulting in a fifteen bit product and places this product on its output. The outputs of 133 and 134 are sent to a summing circuit (137). The output of 137 is the sum of the outputs of 133 and 134. Normally this operation would result in a fifteen bit sum, but again, a decoder would rarely require that much accuracy. The summing device 137 (and 138) need only be built with concern for just a few of the most significant bits. In this case only the six most significant bits are considered. Similarly, the outputs of 135 and 136 are sent to a summing circuit (138). The output of 138 is the sum of the outputs of 135 and 136. Again, only the 6 most significant bits need be considered. The outputs of 137 and 138 are both connected to a decision device (139) and a 12 input 6 output multiplexer. The function of the decision device (139) it to determine which 7 bit input value is larger. If the output from 137 is larger then the output from 138 then the output of the decision device is a single bit logical 1. Otherwise the output is a logical 0. The output of this decision device (139) is connected to the control input of the multiplexer (1310). The two devices (139 and 1310) operate together to perform the function of device 119 in FIG. 11. The output of 1310 is the LLRPA. The LLRPA value would then be connected to the input of a bottom code decoder.

Figure 14:
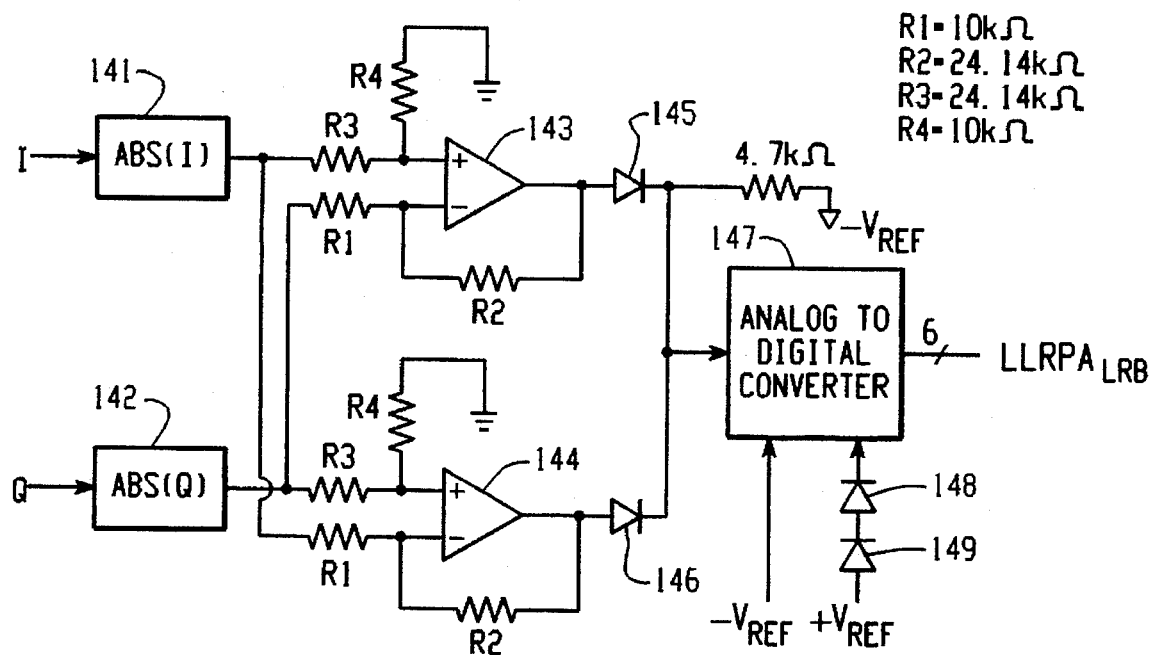
FIG. 14: A block diagram of an analog implementation of the preferred embodiment of the least reliable bit LLRPA.

FIG. 14 is an analog implementation of the basic embodiment of FIG. 11. For an analog implementation, this is the preferred embodiment. The I and Q values come from a demodulator. The I value is connected to an absolute value circuit (141), and the Q value is connected to an absolute value circuit (142). These circuits output the absolute values of I and Q respectively (|I| and |Q|). The outputs of 141 (|I|) and 142 (|Q|) are connected to two weighted difference circuits. The values of resistors $R_1$, $R_2$, $R_3$ and $R_4$ are so chosen to yield a ratio of weighting factors equivalent to $\alpha/\beta$. These two weighted differences are realized via op-amp circuits (143 and 144). The outputs of the two op-amps 143 and 144 are each connected to diodes (145 and 146), then tied together and to a 4.7 kΩ resistor to $-V_{ref}$. The function of the diodes and the 4.7 kΩ resistor is to insure that the voltage signal on the anode of each diode is the larger of the two values on the outputs of op-amps 143 and 144. This value is the LLRPA however, there is an error of one diode voltage drop (−0.7 volts). This is easily corrected for by lowering the higher reference voltage on the analog to digital converter (147) by 2 diode drops (1.4 volts). Provided that $+V_{ref}$ and $-V_{ref}$ are of equal amplitude (±15 volt) the two diode voltage drop on $+V_{ref}$ provided by 148 and 149 will serve to align the zero value of the analog to digital converter's (147) input voltage signal with the zero point. The output of the analog to digital converter is the LLRPA, and would be connected to the input of the C0 code decoder.

Figure 15:
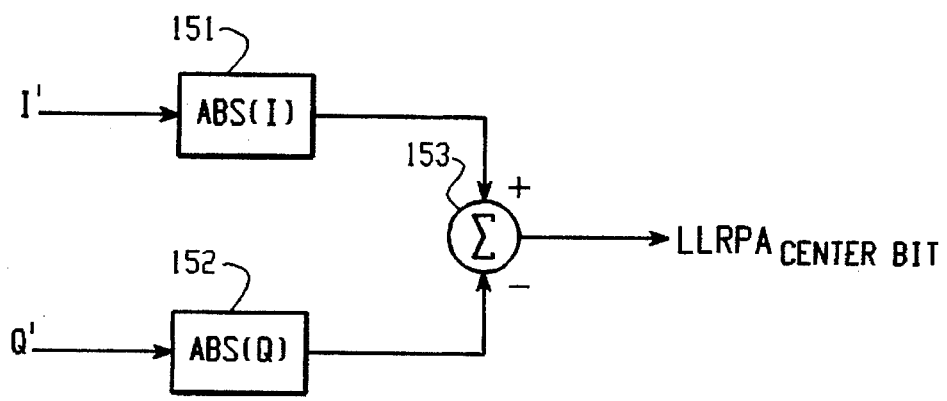
FIG. 15: A block diagram of the preferred embodiment of the center reliable bit LLRPA.

FIG. 15 is a basic block diagram of the preferred embodiment of the LLRPA for the center bit. The I' and Q' values will, in general, need to be computed. As mentioned earlier, this will be either the I and Q data, or a rotation thereof depending on the recoded data from C0. The I' value is connected to an absolute value circuit (151), and the Q' value is connected to an absolute value circuit (152). These circuits output the absolute values of I' and Q' respectively (|I'| and |Q'|). The outputs of 151 and 152 (|I'| and |Q'|) are connected to a difference device 153 which computes the difference |I'|−|Q'| and places it on the output. This is the LLRPA for the center bit. This value would then be the input to a decoder for the C1 code.

Summary, Ramifications, and Scope

Accordingly the reader will see that this invention addresses the need to compute a signal metric in the decoding process of block coded modulation. It has been shown that the planar approximation to the log-likelihood ratio in the least reliable bit (and the center bit) of an 8-PSK modulation format is suitable for practical systems. The approximation results in a negligible degradation in effective SNR as indicated by an approximate error power analysis and verified through simulation results at relevant operating points. The complexity of the LLRPA discussed as a comparison between the implementation of LLRPA and an equivalent memory based LUT evaluating the exact LLR indicates that the LLRPA is simpler, and practical for many systems.

The scope of the invention should be determined by the appended claims and their legal equivalents, rather than by the examples given.

References

[1] H. Imai and S. Hirakawa, "A New Multi-Level Coding Method Using Error-Correcting Codes," *IEEE Trans. Inform. Theory*, Vol. IT-23, No. 3, pp. 371–6, May 1977.

[2] M. Vanderaar, P. Wagner and J. Budinger, "Least Reliable Bits Coding (LRBC) for High Data Rate Satellite Communications," *Proc. AIAA 14th International Communications Satellite System Conference*, Washington, D.C., March 1992, pp. 507–14.

[3] S. Lin and D. J. Costello, Jr., *Error Control Coding: Fundamentals and Applications*. Englewood Cliffs, N.J.: Prentice-Hall, 1983.

[4] H. Woertz and J. Hagenauer, "Multistage Coding and Decoding for a M-PSK System," *Proc. IEEE Global Telecommun. Conf.*, San Diego, Calif., December 1990, pp. 698–703.

We claim:

1. A planar approximating method for computing a binary least-reliable-bit log-likelihood-ratio optimal signal metric to be used by a least-reliable-bit component decoder in 8 phase-shift-keyed block-coded-modulation systems, the method comprising the steps of:

a) computing a first absolute value of an in-phase signal;

b) computing a second absolute value of a quadrature signal simultaneously with the computation of said first absolute value;

c) determining a larger value of said first absolute value and said second absolute value;

d) determining a smaller value of said first absolute value and said second absolute value simultaneously with the determination of said larger value;

e) computing a first product calculated by the multiplication of said larger value by a constant alpha;

f) computing a second product calculated by the multiplication of said smaller value by a constant negative beta simultaneously with the calculation of said first product;

g) computing an estimate of said binary least-reliable-bit log-likelihood-ratio optimal signal metric computed by addition of said first product and said second product.

2. A digital circuit based embodiment of a planar approximating method for computing a binary least-reliable-bit log-likelihood-ratio optimal signal metric to be used by a least-reliable-bit component decoder in 8 phase-shift-keyed block-coded-modulation systems, comprising:

a) a device for computing a first digital absolute value of a digital in-phase signal;

b) a device for computing a second digital absolute value computation on a digital quadrature signal simultaneously with the computation of said first digital absolute value;

c) a device for determining a binary logical value that represents whether said first digital absolute value is smaller than said second digital absolute value;

d) a first switch device for choosing said first digital absolute value if said binary logical value is a logical one and said second digital absolute value if said binary logical value is a logical zero;

e) a second switch device for choosing said second digital absolute value if said binary logical value is a logical one and said first digital absolute value if said binary logical value is a logical zero simultaneously with the said first switch device;

f) a first digital multiplication device for computing a first digital product of said first switch value by a digital constant alpha;

g) a second digital multiplication device for computing a second digital product of said second switch value by a digital constant negative beta simultaneously with said first digital multiplication device;

h) a digital adder device for computing a sum of said first digital product and said second digital product resulting in an estimate of said binary least-reliable-bit log-likelihood-ratio optimal signal metric.

3. A planar approximating method for computing a binary least-reliable-bit log-likelihood-ratio optimal signal metric to be used by a least-reliable-bit component decoder in 8 phase-shift-keyed block-coded-modulation systems, the method comprising the steps of:

a) computing a first absolute value of an in-phase signal;

b) computing a second absolute value of a quadrature signal simultaneously with the computation of said first absolute value;

c) computing a first product by the multiplication of said first absolute by a constant alpha;

d) computing a second product by the multiplication of said first absolute value by a constant negative beta simultaneously with the computation of said first product;

e) computing a third product by the multiplication of said second absolute value by a constant alpha simultaneously with the computation of said first product;

f) computing a fourth product by the multiplication of said second absolute value by a constant negative beta simultaneously with the computation of said first product;

g) computing a first sum by the addition of said second product and said third product;

h) computing a second sum by the addition of said first product and said fourth product simultaneously with the computation of said first sum;

i) determining a larger value of said first sum and said second sum resulting in an estimate of said binary least-reliable-bit log-likelihood-ratio optimal signal metric.

4. A digital circuit based embodiment of a planar approximating method for computing a binary least-reliable-bit log-likelihood-ratio optimal signal metric to be used by a least-reliable-bit component decoder in 8 phase-shift-keyed block-coded-modulation systems, comprising:

a) a device for computing a first digital absolute value of a digital in-phase signal;

b) a device for computing a second digital absolute value of a digital quadrature signal simultaneously with the computation of said first digital absolute value;

c) a first digital multiplication device for computing a first digital product of said first digital absolute value by a digital constant alpha;

d) a second digital multiplication device for computing a second digital product of said first digital absolute value by a digital constant negative beta simultaneously with said first digital multiplication device;

e) a third digital multiplication device for computing a third digital product of said second digital absolute value by a digital constant alpha simultaneously with said first digital multiplication device;

f) a fourth digital multiplication device for computing a fourth digital product of said second digital absolute value by a digital constant negative beta simultaneously with said first digital multiplication device;

g) a first digital adder device for computing a first digital sum of said second digital product and said third digital product;

h) a second digital adder device for computing a second digital sum of said first digital product and said fourth digital product;

i) a device for determining a binary logical value that represents whether said first digital sum value is larger than said second digital sum;

j) a switch device for choosing said first digital sum if said binary logical value is a logical one and said second digital sum if said binary logical value is a logical zero resulting in an estimate of said binary least-reliable-bit log-likelihood-ratio optimal signal metric.

5. An analog circuit based embodiment of a planar approximating method for computing a binary least-reliable-bit log-likelihood-ratio optimal signal metric to be used by a least-reliable-bit component decoder in 8 phase-shift-keyed block-coded-modulation systems, comprising:

a) a device for computing a first analog absolute value of an analog in-phase signal;

b) a device for computing a second analog absolute value of an analog quadrature signal simultaneously with the computation of said first analog absolute value;

c) an operational amplifier circuit whose output is a maximum of a first weighted difference of said first analog absolute value and said second analog absolute value or a second weighted difference of said second analog absolute value and said first analog absolute value;

d) an analog to digital conversion device that converts said maximum, with a direct current voltage offset, providing an estimate of said binary least-reliable-bit log-likelihood-ratio optimal signal metric.

6. A planar approximating method for computing a binary middle-reliable-bit log-likelihood ratio optimal signal metric to be used by a middle-reliable-bit component decoder in 8 phase-shift-keyed block-coded-modulation systems, the method comprising the steps of:

a) computing a first absolute value of an in-phase signal;
   b) computing a second absolute value of a quadrature signal simultaneously with the computation of said first absolute value;
   c) computing an estimate of said binary middle-reliable-bit log-likelihood-ratio optimal signal metric calculated by a subtraction of said second absolute value from said first absolute value.

7. A digital circuit based embodiment of a planar approximating method for computing a binary middle-reliable-bit log-likelihood-ratio optimal signal metric to be used by a middle-reliable-bit component decoder in 8 phase-shift-keyed block-coded-modulation systems, comprising:

a) a device for computing a first digital absolute value of a digital in-phase signal;
   b) a device for computing a second digital absolute value computation on a digital quadrature signal simultaneously with the computation of said first digital absolute value;
   c) a digital subtractor device for computing the difference of said first digital absolute value and said second digital absolute value resulting in an estimate of said binary middle-reliable-bit log-likelihood-ratio optimal signal metric.

8. An analog circuit based embodiment of a planar approximating method for computing a binary middle-reliable-bit log-likelihood-ratio optimal signal metric to be used by a middle-reliable-bit component decoder in 8 phase-shift-keyed block-coded-modulation system, comprising:

a) a device for computing a first analog absolute value of an analog in-phase signal;
   b) a device for computing a second analog absolute value computation on an analog quadrature signal simultaneously with the computation of said first analog absolute value;
   c) an operational amplifier circuit device to compute the difference of said first analog absolute value and said second analog absolute value resulting in an estimate of said binary middle-reliable-bit log-likelihood-ratio optimal signal metric.

\* \* \* \* \*